United States Patent
Guenther

(10) Patent No.: US 8,063,810 B2
(45) Date of Patent: Nov. 22, 2011

(54) UNFOLDING VCO-BASED QUANTIZATION CIRCUIT

(75) Inventor: Christopher G. Guenther, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 12/512,576

(22) Filed: Jul. 30, 2009

(65) Prior Publication Data

US 2011/0025541 A1 Feb. 3, 2011

(51) Int. Cl.
*H03M 1/60* (2006.01)

(52) U.S. Cl. .................................. 341/157; 341/155

(58) Field of Classification Search .............. 341/157, 341/143, 155, 172, 170; 370/538
See application file for complete search history.

(56) References Cited

U.S. PATENT DOCUMENTS

| 6,700,520 | B1 | 3/2004 | Miller | |
|---|---|---|---|---|
| 2002/0186804 | A1* | 12/2002 | Dorschky et al. | 375/376 |
| 2007/0139240 | A1* | 6/2007 | Mitteregger et al. | 341/143 |

OTHER PUBLICATIONS

Straayer, M., et al., "A 12-Bit, 10-MHz Bandwidth, Continuous-Time ADC With a 5-Bit, 950-MS/s VCO-Based Quantize," in IEEE J. Solid-State Circuits, vol. 43, No. 4, pp. 805-814, Apr. 2008.

* cited by examiner

*Primary Examiner* — Joseph Lauture
(74) *Attorney, Agent, or Firm* — Ingrassia Fisher & Lorenz, PC

(57) ABSTRACT

Apparatus and methods are provided for a voltage-controlled oscillator (VCO) quantization circuit. A quantization circuit comprises an input node for an input signal, a VCO quantizer coupled to the input node, and an output generation module coupled to the VCO quantizer. The VCO quantizer is configured to generate a digital code that is representative of the input signal, wherein the digital code has a first code range. The output generation module generates a digital output value based on the digital code, wherein the digital output value has a second code range being greater than the first code range.

18 Claims, 3 Drawing Sheets

UNFOLDING VCO-BASED QUANTIZATION CIRCUIT

TECHNICAL FIELD

Embodiments of the subject matter described herein relate generally to electronic circuits, and more particularly, embodiments of the subject matter relate to voltage-controlled oscillator based quantization circuits utilizing a voltage-controlled oscillator.

BACKGROUND

In many modern electronics applications, it is desirable to convert an analog signal to a digital value. For example, in a radio frequency (RF) transceiver, a received analog RF signal may be demodulated to an analog baseband signal which is then converted to a digital baseband signal for subsequent digital signal processing. In some applications, voltage-controlled oscillator (VCO) quantizers are used to convert an analog signal to a digital representation. In a VCO quantizer, an analog input signal controls the oscillation frequency of a VCO, where the oscillation frequency is proportionally related to the magnitude of the analog input signal. The number of oscillations within the sampling period are counted, resulting in a digital value that corresponds to the magnitude of the analog input signal.

Many VCOs in VCO quantizers consist of an odd number of delay stages (or delay cells) configured as a ring oscillator. In some prior art systems, the number of delay stages correspond to the number of quantization levels achievable by the VCO quantizer. Each delay stage is often realized as a complementary metal-oxide-semiconductor (CMOS) inverter (or NOT logic gate). However, in order to achieve high linearity and satisfy other performance metrics, in practice, the CMOS inverters are realized as specialized semiconductor devices that consume substantially more area and power than the other elements of the VCO quantizer when the VCO quantizer is implemented in circuitry.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
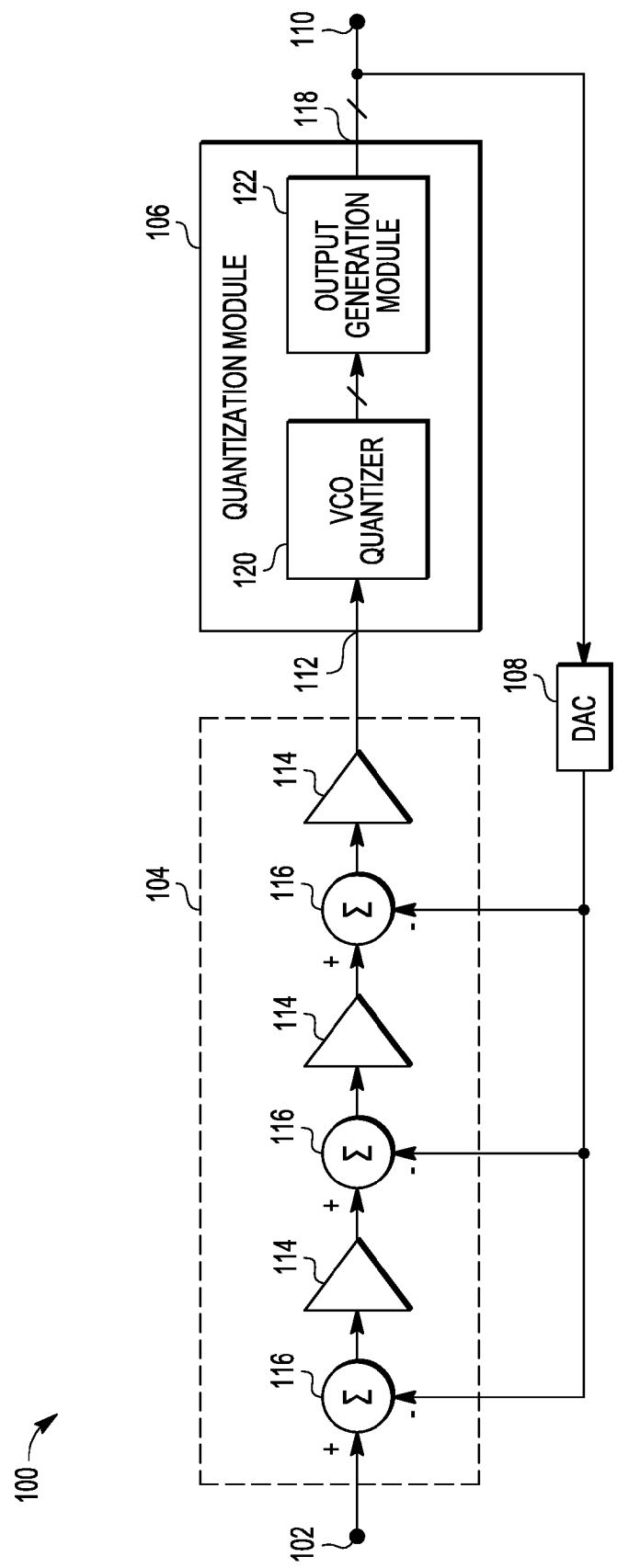
FIG. 1 is a block diagram of an analog-to-digital converter in accordance with one embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The following description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

For the sake of brevity, conventional techniques related to voltage-controlled oscillators (VCOs), VCO-based quantizers, signal processing, sampling, analog-to-digital conversion, digital-to-analog conversion, analog circuit design, differential circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof. In addition, certain terminology may also be used in the following description for the purpose of reference only, and thus are not intended to be limiting, and the terms "first", "second" and other such numerical terms referring to structures do not imply a sequence or order unless clearly indicated by the context.

Technologies and concepts discussed herein relate to VCO-based quantization circuits that utilize a VCO quantizer to achieve a higher number of quantization levels than those normally achievable by the VCO quantizer. For example, the VCO-based quantization circuit may utilize a VCO quantizer configured for n levels of quantization (e.g., a VCO quantizer having n quantization stages and a code range of 0-n) to achieve higher levels of quantization (e.g., larger code range). As used herein, the code range of a quantizer should be understood as referring to the range between the minimum code (or full scale minimum) and maximum code (or full scale maximum) code values that quantizer is capable of resolving an analog signal into. In an exemplary embodiment, a VCO-based quantization circuit utilizes an n-level VCO quantizer (e.g., a code range of 0-n or n+1 effective quantization levels) to achieve a 2n code range (e.g., a code range of 0-(2n−1) or 2n effective quantization levels).

As described in greater detail below, the VCO-based quantization circuit detects a fold condition in the VCO quantizer and corrects (or unfolds) the output of the VCO quantizer to achieve a higher code range. As used herein, a fold condition should be understood as referring to a condition where the input voltage (or control voltage) for a VCO within a VCO quantizer causes the oscillating signal within the VCO to propagate through more than the number of stages of the VCO during a sampling interval. In this regard, a fold condition occurs in the VCO quantizer when the input voltage to the VCO causes an oscillation frequency greater than $$\frac{f_s}{2},$$

where $f_s$ is the sampling frequency. As described in greater detail below, the fold condition results in the output of the VCO quantizer being equal to n−k, where n is the integer number of delay stages (or elements) of the VCO and k is the number of delay stages (or elements) of the VCO greater than n that the oscillating signal has propagated through during the most recent sampling interval. The quantization circuit detects the fold condition and unfolds the output of the VCO quantizer such that the output of the quantization circuit corresponds to n+k. As a result, to achieve a desired output code range, the VCO quantizer may be reduced by roughly a factor of two, thereby reducing the power and area consumed by the VCO.

FIG. 1 depicts an analog-to-digital converter (ADC) 100 that is configured in accordance with an exemplary embodiment. The ADC 100 may include, without limitation, an input node 102 for receiving an analog input signal, a forward signal arrangement 104, a quantization module (or quantizer) 106, a feedback signal arrangement 108, and digital output interface 110. The elements of ADC 100 are suitably configured to produce a digital value at the digital output interface 110 that is representative of an analog input signal at the input node 102. As described in greater detail below, the quantization module 106 is configured to generate the digital value at the digital output interface 110 with a code range and/or number of quantization levels using a VCO quantizer 120 configured for a narrower code range and/or fewer quantization levels.

It should be understood that FIG. 1 is a simplified diagram of the ADC 100 depicted in single-ended form, and practical embodiments of the ADC 100 may include additional or alternative components, and/or be implemented in a differential manner (e.g., a differential circuit adapted for differential input signals). Furthermore, although the ADC 100 depicted in FIG. 1 is realized using a third-order sigma-delta feedback topology, it should be understood that the subject matter described herein is not limited to a particular implementation. The subject matter may be extended to or adapted for an ADC of any order, and may apply to other ADC topologies, such as, for example, feedforward topologies or cyclic converters. Furthermore, although the subject matter may be described herein in the context of a sigma-delta feedback ADC application, the subject matter is not intended to be limited to any particular application.

In an exemplary embodiment, the forward signal arrangement 104 is coupled between the input node 102 and an input 112 of the quantizer 106 (alternatively, the quantizer input) and establishes a forward signal path from the input node 102 to the quantizer input 112. As shown in FIG. 1, the forward signal arrangement 104 comprises a plurality of integrators 114 and a plurality of summing junctions 116 suitably configured as a third order sigma-delta feedback topology. In the illustrated embodiment, the forward signal arrangement 104 produces an analog signal at the quantizer input 112 based on the input signal at the input node 102 and a feedback signal provided from the feedback signal arrangement 108.

In an exemplary embodiment, the quantizer 106 generates a digital value having a code range of m (i.e., 0-(m−1)) at its output 118 that is representative of the analog signal (or analog voltage level) at the quantizer input 112 using a n-level VCO quantizer 120, that is, a VCO quantizer 120 utilizing an n-element VCO for an output code range of 0-n, where n is less than m. As described in greater detail below, an n-element VCO should be understood as referring to a VCO with n number of delay stages. In an exemplary embodiment, the quantizer 106 uses the n-level VCO quantizer 120 to achieve an output code range of 0-(2n−1) (e.g., m=2n). The n-level VCO quantizer 120 generates an n-bit thermometer code representation of the analog signal at the quantizer input 112. In this regard, the thermometer code is a base one code, wherein the number of bits in the thermometer code that are logical '1' is directly proportional to the analog signal. As described in greater detail below, the quantizer 106 includes an output generation module 122 configured to detect a fold condition in the VCO quantizer 120, and in response, unfold the digital code from the VCO quantizer 120 to generate a digital value at the output 118 of the quantizer 106 (alternatively, the quantizer output) based on the digital code having a code range of m. The quantizer output 118 is coupled to the digital output interface 110 and provides the digital value to the digital output interface 110. The digital value at the digital output interface 110 may be encoded using a different numerical base system (e.g., a binary or base two digital value), as will be appreciated in the art.

In an exemplary embodiment, the feedback signal arrangement 108 is coupled between the digital output interface 110 (or quantizer output 118) and the summing junctions 116 of the forward signal arrangement 104 to create a closed-loop feedback path. In this regard, the feedback signal arrangement 108 comprises a digital-to-analog conversion module configured to convert the digital value at the quantizer output 118 (or digital output interface 110) to an analog feedback signal, wherein the forward signal arrangement 104 generates the analog signal at the quantizer input 112 based on the input signal at the input node 102 and the analog feedback signal from the feedback signal arrangement 108, as will be appreciated in the art. In an exemplary embodiment, the digital-to-analog conversion module comprises a plurality of digital-to-analog converters (DACs), wherein each DAC is coupled to or otherwise associated with a respective bit of the quantizer output 118. As described in greater detail below, the quantizer 106 and/or output generation module 122 is configured to toggle the digital value at the quantizer output 118 in order to randomize the DACs 108 used to convert the digital value to the analog feedback signal, thereby whitening the noise and/or distortion caused by mismatch among the DACs 108. It should be understood that although FIG. 1 depicts a feedback path 108 comprising a single digital-to-analog conversion module, in practice, multiple single digital-to-analog conversion modules may be utilized in the feedback path 108 of the ADC 100, as will be appreciated in the art.

Figure 2:
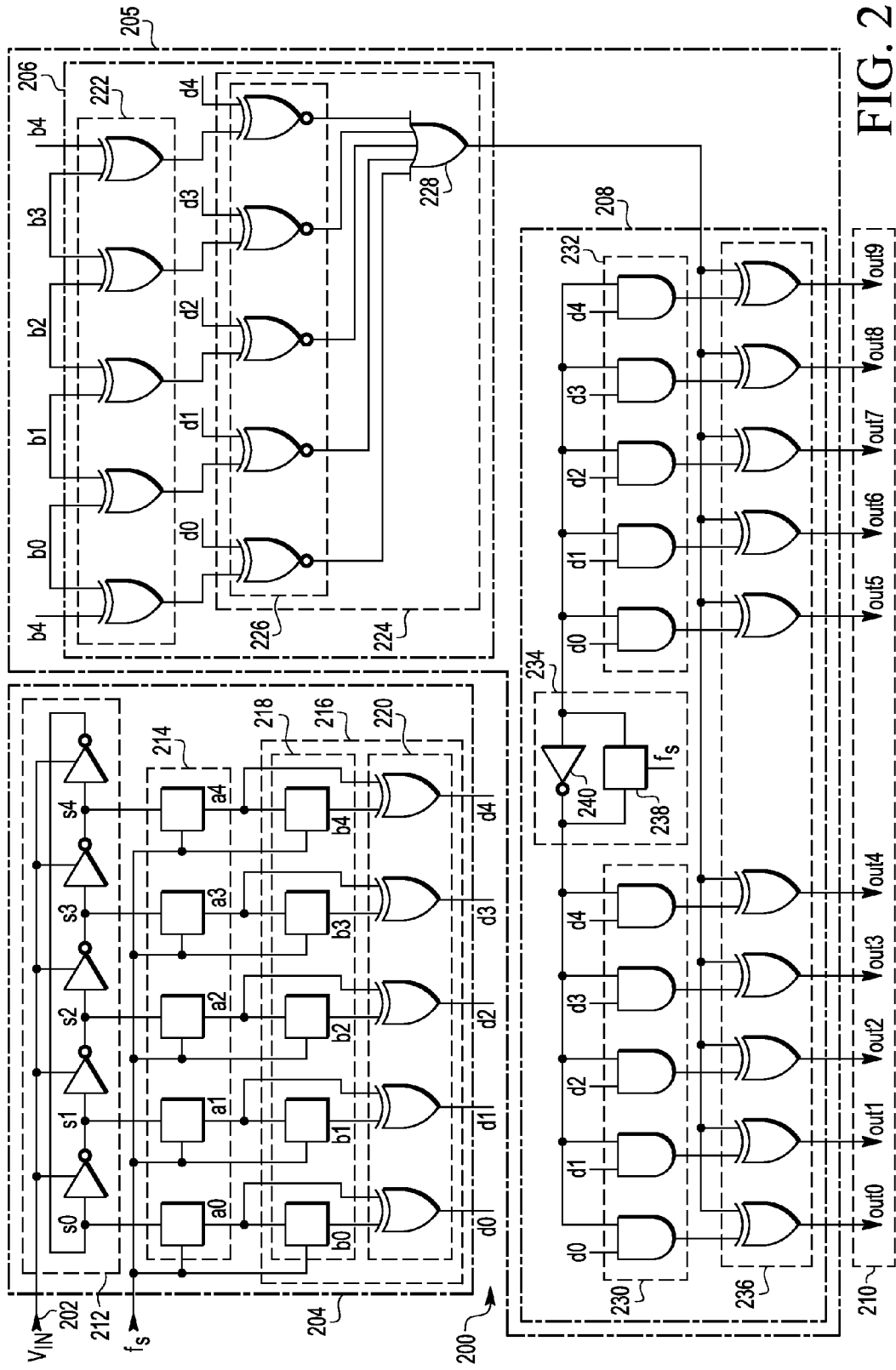
FIG. 2 is a schematic view of a quantization circuit suitable for use in the analog-to-digital converter of FIG. 1 in accordance with one embodiment of the invention.

FIG. 2 depicts an exemplary embodiment of a quantization circuit 200 suitable for use as the quantization module 106 in the ADC 100 of FIG. 1. In an exemplary embodiment, the quantization circuit 200 includes, without limitation an input node 202, a VCO quantizer 204, an output generation module 205, and a digital output interface 210. The quantization circuit 200 converts an analog input signal or analog input voltage level ($V_{IN}$) at the input node 202 (e.g., quantizer input 112) to a digital value at the digital output interface 210 (e.g., quantizer output 118) that is representative of the analog input signal ($V_{IN}$). In this regard, an n-level VCO quantizer 204 is utilized for a digital representation of the input signal at the digital output interface 210 having an output code range of 0-(2n−1). As described in greater detail below, the output generation module 205 includes fold detection circuitry 206 and output generation circuitry 208. The fold detection circuitry 206 is coupled to the VCO quantizer 204 and configured to detect or otherwise identify a fold condition in the VCO quantizer 204. The output generation circuitry 208 is coupled to the VCO quantizer 204 and the fold detection circuitry 206 and generates an unfolded 2n-bit representation of the input signal in response to a fold condition, as described in greater detail below.

FIG. 2 illustrates a quantization circuit 200 suitable for generating an output value with 10 levels of quantization (e.g., m=10), that is, a digital output value having a code range of 0-9, using a 5-level VCO quantizer 204 (e.g., n=5). It should be understood that FIG. 2 is a simplified representation of a quantization circuit 200 for purposes of explanation and ease of description, and FIG. 2 is not intended to limit the application or scope of the subject matter in any way. In this regard, practical embodiments of the quantization circuit 200 may include additional or alternative components, and/or be implemented in a differential manner, as will be appreciated in the art. Thus, although FIG. 2 illustrates a quantization circuit 200 configured for an output code range of 0-9 using a 5-level VCO quantizer 204, it will be appreciated in the art that the quantization circuit 200 may be adapted for any output code range. Additionally, although FIG. 2 depicts direct electrical connections between circuit elements and/or terminals, alternative embodiments may employ intervening circuit elements and/or components while functioning in a substantially similar manner. Furthermore, it should be noted that although FIG. 2 depicts one particular implementation of the digital circuitry comprising the quantization circuit 200, numerous equivalent circuits may be implemented by modifying the type and/or configuration of the logic gates to achieve substantially the same function.

In an exemplary embodiment, the n-level VCO quantizer 204 generates an n-bit thermometer code (e.g., a code range of 0-n) based on the analog voltage level ($V_{IN}$) at the input node 202. As shown in FIG. 2, the VCO quantizer 204 generates a 5-bit thermometer code output (e.g., d0-d4), with an output code range from zero ('00000') to five ('11111'). The VCO quantizer 204 includes a VCO 212, a quantization arrangement 214, and a differentiation arrangement 216. The VCO 212 is coupled to the input node 202 and generates an oscillating signal with a frequency that is based on the input signal level ($V_{IN}$). In an exemplary embodiment, the VCO 212 comprises an electronic oscillator having n number of delay stages (or delay cells) suitably configured as a ring oscillator. In this regard, an n-element VCO should be understood as referring to a VCO with n number of delay stages. In an exemplary embodiment, the VCO 212 comprises n CMOS inverters configured such that the oscillation frequency of the VCO 212 is linearly dependent on the input signal level at the input node 202, that is, as the analog input voltage level ($V_{IN}$) increases and/or decreases the oscillation frequency increases and/or decreases by a corresponding amount. As shown in FIG. 2, the VCO 212 includes five inverters (n=5) configured as a ring oscillator. It should be understood that FIG. 2 is a simplified representation of the VCO 212 for purposes of explanation, and in practical embodiments, the VCO 212 may include any number of delay stages and each delay stage (or inverter) may comprise one or more transistors.

The quantization arrangement 214 is coupled to the VCO 212 and samples and/or captures the state of the VCO 212, that is, the values at the input/output of each inverter (e.g., s0-s4) with a sampling rate, $f_s$. In an exemplary embodiment, the sampling rate ($f_s$) is greater than (e.g., a factor of two or more) the frequency of the analog signal at the input node 202 such that the input signal is oversampled, as will be appreciated in the art. The quantization arrangement 214 comprises n sampling elements, with each sampling element having its input connected between a different pair of inverters of the VCO 212. Depending on the embodiment, the sampling elements of the quantization arrangement 214 may be realized as flip-flops, registers, latches, or another suitable bi-stable sampling element known in the art. The output of the quantization arrangement 214 (e.g., a0-a4) represents the state of the VCO 212 (e.g., s0-s4) at the time of the most recent sample (alternatively referred to as the current sample), as will be appreciated in the art.

The differentiation arrangement 216 is coupled to the quantization arrangement 214 and configured to perform a first order difference operation based on the state of the VCO 212 at the current sample and the state of the VCO 212 at the preceding sample. The differentiation arrangement 216 includes n sampling elements 218, with each sampling element being connected to a sampling element of the quantization arrangement 214. The sampling elements 218 sample and/or capture the state of the quantization arrangement 214 with a sampling rate, $f_s$, such that the output of the sampling elements 218 (e.g., b0-b4) represents the state of the VCO 212 (e.g., s0-s4) at the preceding sampling time. The differentiation arrangement 216 also includes n exclusive or (XOR) logic gates 220, with each XOR gate being connected to a sampling element of the quantization arrangement 214 and a sampling element of the differentiation arrangement 216. In this regard, the output of each XOR gate corresponds to the difference (or exclusive disjunction) between the current sample (e.g., a0-a4) and the preceding sample (e.g., b0-b4) at a particular location within the VCO 212. In the absence of a fold condition, the output of the differentiation arrangement 216 (e.g., d0-d4) comprises a thermometer code representative of the number of delay stages (e.g., inverters) of the VCO 212 that the oscillating signal propagated through within the preceding sampling interval (e.g., $1/f_s$), as will be appreciated in the art.

The output generation module 205 generates a digital output value having an output code range of 2n (i.e., 0-(2n−1)) based on the thermometer code output of the VCO quantizer 204. As described in greater detail below, the output generation module 205 shown in FIG. 2 generates a 10-bit thermometer code output (e.g., out0-out9), with an output code range from zero ('0000000000') to nine ('1111111110'). The fold detection circuitry 206 is coupled to the VCO quantizer 204 and detects or identifies a fold condition in the VCO quantizer 204, that is, an input voltage ($V_{IN}$) at the input node 202 that causes the oscillating signal to propagate through more than the n delay stages (e.g., inverters) that comprise the VCO 212.

As described in greater detail below, the fold detection circuitry 206 detects a fold condition by identifying a location of the phase of the oscillating signal in the VCO 212 from the preceding sample and comparing the logic level of at the identified phase location for the current sample to the logic level at the identified phase location for the preceding sample. As used herein, the location of the phase (or phase location) of the oscillating signal should be understood as referring to a location of within the VCO 212 that would be the first location within the VCO 212 to change its state to a different logic level after sampling (e.g., after the sampling clock edge). For example, if two adjacent locations within the VCO 212 are have a common logic level (e.g., both equal to logical high or '1' or logical low or '0'), then the location of the two adjacent locations that is the succeeding location in the direction of propagation of the oscillating signal is the location of the phase of the oscillating signal because the succeeding location should change its state to a different logic level at the following sample (e.g., one sampling interval after the preceding sample) time if the oscillation frequency is less than or equal to For example, if s0=1 and s1=1, then at the next sampling time, the value of s0 should cause the inverter preceding s1 to change its output, such that s1 should be equal to logical low or '0' at the following sample when the oscillation frequency is less than $$\frac{f_s}{2}.$$

Thus, when the logic level at the identified phase location for a current sample is equal to the logic level at the identified phase location at a preceding sample, the oscillation frequency of the VCO 212 is greater than $$\frac{f_s}{2},$$

that is, a fold condition exists in the VCO quantizer 204. For example, if the phase location corresponds to s1, when the logic level at s1 for a current sample (a1) is equal to the logic level at s1 at a preceding sample (i.e., a1=b1), the oscillation frequency of the VCO 212 is greater than $$\frac{f_s}{2}$$

and a fold condition exists in the VCO quantizer 204. In this regard, the fold detection circuitry 206 detects or identifies a fold condition when the logic level at the identified phase location for the current sample is equal to (or unchanged from) the logic level at the identified phase location for the preceding sample.

In an exemplary embodiment, the fold detection circuitry 206 comprises a phase detection arrangement 222 and a fold detection arrangement 224. The phase detection arrangement 222 is coupled to the sampling elements 218 of the differentiation arrangement 216 and detects and/or identifies the location of the phase of the oscillating signal at the preceding sample. In the illustrated embodiment, the phase detection arrangement 222 comprises n XOR gates, with each XOR gate being configured to compare adjacent locations of the VCO 212 from the preceding sample as shown. The fold detection arrangement 224 comprises n logical nor (NOR) gates. Each NOR gate has one input that is connected to a respective XOR gate of the phase detection arrangement 222 and another input that is connected to a respective output of the VCO quantizer 204 that corresponds to the succeeding location of the two inputs of the respective XOR gate of the phase detection arrangement 222. For example, if one input of a first NOR gate corresponds to the XOR of b0 and b4, then the second input of the NOR gate is connected to output d0 which corresponds to the succeeding location of b0 and b4, as shown. As shown, the fold detection arrangement 224 includes a logical or (OR) gate 228 configured to logically or the outputs of the NOR gates 226.

It should be noted that when two adjacent locations have the same logic level for the preceding sample, the output of the respective XOR gate will be a logical low or '0'. In addition, a respective output of the VCO quantizer 204 that is input to a respective NOR gate will be a logical '0' when the corresponding location in the VCO 212 had the same logic level at the current sample and the preceding sample. Thus, when the logic level at an identified phase location of the VCO 212 is equal to (or unchanged from) the logic level at the identified phase location for the preceding sample, then both inputs to the respective NOR gate will be logical low or '0', causing the output of the respective NOR gate to be a logical high or '1'. When at least one NOR gate output is logical high or '1', the output of the OR gate 228 and/or fold detection circuitry 206 is logical high or '1', indicating that a fold condition has occurred. In this manner, the fold detection circuitry 206 identifies the location of the phase of the VCO 212 when adjacent locations have the same (or equal) logic level for the preceding sample and detects the fold condition when the logic level at the identified phase location for the current sample is equal to (or unchanged from) the logic level at the identified phase location for the preceding sample.

In an exemplary embodiment, the output generation circuitry 208 is coupled to the VCO quantizer 204 and the fold detection circuitry 206 and unfolds the digital output code from the VCO quantizer 204 (e.g., d0-d4) in response to a fold condition detected by the fold detection circuitry 206. In the illustrated embodiment, the output generation circuitry 208 includes 2n logical and (AND) gates arranged into two sets of n AND gates 230, 232. Each set of AND gates 230, 232 is associated with the output of the VCO quantizer 204, such that each set of AND gates 230, 232 includes an AND gate having an input associated with a respective output of the VCO quantizer 204. In an exemplary embodiment, the output generation circuitry 208 includes a toggle switch 234 configured to toggle which set of AND gates 230, 232 that the digital code from the VCO quantizer 204 passes through. As described in greater detail below, the output of one set of AND gates 230, 232 will be equal to zero while the output of the other set of AND gates 230, 232 will be equal to the output of the VCO quantizer 204, or in other words, the output of the VCO quantizer 204 passes through one set of AND gates 230, 232.

In an exemplary embodiment, the output generation circuitry 208 includes 2n XOR gates 236 coupled between the AND gates 230, 232 and the digital output interface 210. As shown in FIG. 2, each XOR gate has a first input connected to an output of a respective AND gate and the second input of each XOR gate is connected to the output of the fold detection circuitry 206 (e.g., the output of the OR gate 228). In this regard, if there is no fold condition in the VCO quantizer 204, the output of the OR gate 228 and/or fold detection circuitry 206 is a logical low or '0', such that the output of the AND gates 230, 232 passes through the XOR gates 236 unchanged to the output 210. When the fold detection circuitry 206 detects a fold condition in the VCO quantizer 204, the output of the OR gate 228 in the fold detection circuitry 206 is a logical high or '1', such that the output of the AND gates 230, 232 is inverted by the XOR gates 236. In this manner, the output generation circuitry 208 unfolds the output of the VCO quantizer 204 by inverting the digital code from the VCO quantizer 204 to obtain the digital value at the output 210.

Referring now to FIGS. 1 and 2, in accordance with one or more embodiment, the DAC module 108 includes 2n 1-bit DACs, with each DAC having an input connected to the output of a respective XOR gate 236. In this regard, in an exemplary embodiment, the output generation module 122, 205 is configured to toggle the digital output value among the DACs in order to decouple the mismatch noise of the DACs 108 from the input signal level and/or input node 202, thereby reducing signal distortion in the sigma-delta ADC 100 caused by the mismatch noise repeatedly occurring in a particular pattern. In this regard, the toggle switch 234 comprises an inverter 240 configured to toggle its output state by feeding back the output of the inverter 240 to its input via a sampling element 238 that is clocked at the sampling rate ($f_s$). As shown, one set of AND gates 230 is arranged such that each AND gate of the set 230 has an input connected to the output of the inverter 240, while the other set of AND gates 232 is arranged such that each AND gate of the set 232 has an input connected to the input of the inverter 240. In this manner, the input to one set of AND gates 230, 232 from the toggle switch 234 will be a logical high or '1' while the input to the other set of AND gates 230, 232 will be a logical low or '0'. As a result, the set of AND gates 230, 232 that the output of the VCO quantizer 204 passes through is toggled back and forth from one set of AND gates to the other at the sampling rate.

Referring now to FIG. 2, for purposes of explanation, in an exemplary case, the state of the VCO 212 (e.g., s0-s4) may be '10101' at the preceding sample (e.g., b0-b4) and '01011' at the current sample (e.g., a0-a4). The output of the XOR gates 220 of the VCO quantizer 204 will be '11110' corresponding to a thermometer code value of 4, that is, the oscillating signal in the VCO 212 has propagated through four delay stages of the VCO 212. The fold detection circuitry 206 and/or phase detection arrangement 222 detects the phase of the VCO 212 at the location corresponding to s0 because b0 and b4 are equal. However, because the logic level at the identified phase location for the current sample is not equal to the logic level at the identified phase location from the preceding sample (e.g., a0≠b0 or the XOR of a0 and b0 is equal to logical high or '1'), the fold detection circuitry 206 does not detect a fold condition in the VCO quantizer 204 and the output of the fold detection circuitry 206 and/or OR gate 228 is a logical low or '0'. As a result, the output of the VCO quantizer 204 (d0-d4) passes through one set of AND gates 230, 232 and the output of the quantization circuit 200 (e.g., out0-out9) will be equal to either '1111000000' or '0000011110' (depending on which set of AND gates 230, 232 the output of the VCO quantizer 204 passes through), which corresponds to a thermometer code value of 4.

However, in another case, the state of the VCO 212 (e.g., s0-s4) may be '10101' at the preceding sample (e.g., b0-b4) and '11011' at the current sample (e.g., a0-a4). In this case, the oscillating signal propagated through six delay stages of the VCO 212 during the previous sampling interval, however, the output of the XOR gates 220 of the VCO quantizer 204 will be '11110' corresponding to a thermometer code value of 4 (e.g., n−k). In this case, the fold detection circuitry 206 and/or phase detection arrangement 222 detects the phase of the VCO 212 at the location corresponding to s0 because b0 and b4 are equal. However, because the logic level at the identified phase location for the current sample is equal to the logic level at the identified phase location for the preceding sample (e.g., a0=b0 or the XOR of a0 and b0 is equal to logical low or '0'), the fold detection circuitry 206 detects a fold condition in the VCO quantizer 204 and the output of the fold detection circuitry 206 and/or OR gate 228 is a logical high or '1'. In response to the fold condition detected by the fold detection circuitry 206, the output generation circuitry 208 unfolds the digital code from the VCO quantizer 204 by inverting the output (d0-d4) that passes through one set of AND gates 230, 232 along with the output of the other set of AND gates 230, 232. As a result, the output of the quantization circuit 200 (e.g., out0-out9) is unfolded and equal to either '1000011111' or '1111110000' (depending on which set of AND gates 230, 232 the output of the VCO quantizer 204 passes through), corresponding to a thermometer code value of 6 (e.g., n+k).

Figure 3:
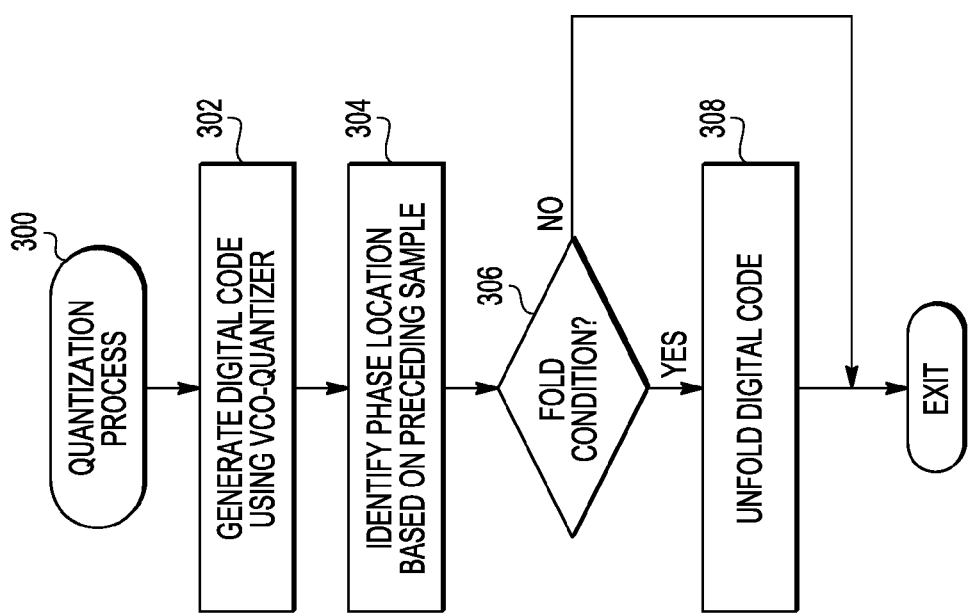
FIG. 3 is a flow diagram of a quantization process suitable for use with the analog-to-digital converter of FIG. 1 or the quantization circuit of FIG. 2 in accordance with one embodiment of the invention.

Referring now to FIG. 3, in an exemplary embodiment, a quantization circuit may be configured to perform a quantization process 300 and additional tasks, functions, and operations described below. The various tasks may be performed by software, hardware, firmware, or any combination thereof. For illustrative purposes, the following description may refer to elements mentioned above in connection with FIG. 1 and FIG. 2. In practice, the tasks, functions, and operations may be performed by different elements of the described system, such as the VCO quantizer 120, 204, the output generation module 122, 205, the fold detection circuitry 206, and/or the output generation circuitry 208. It should be appreciated that any number of additional or alternative tasks may be included, and may be incorporated into a more comprehensive procedure or process having additional functionality not described in detail herein.

Referring to FIG. 3, and with continued reference to FIG. 1 and FIG. 2, a quantization process 300 may be performed to convert an analog input signal to a digital output value. In an exemplary embodiment, the quantization process 300 begins by generating a digital code with a first code range using a voltage-controlled oscillator (VCO) quantizer, the digital code having a first code range (task 302). In an exemplary embodiment, the VCO quantizer generates the digital code by generating a thermometer code having the first number of bits corresponding to the number of delay stages and/or quantization stages of the VCO quantizer, wherein the first code range of the digital code corresponds to zero through the number of delay stages and/or quantization stages of the VCO quantizer. In this regard, for an n-level VCO quantizer (or a VCO quantizer with an n-element VCO), the first code range corresponds to 0-n or alternatively, a digital code range of n+1 quantization levels. For example, the 5-level VCO quantizer 204 of FIG. 2 comprising a 5-element VCO 212 generates a digital code range of 0-5 (i.e., '00000' to '11111'), or alternatively, a digital code range of 6 quantization levels.

In an exemplary embodiment, the quantization process 300 continues by identifying a location of a phase of the oscillating signal in the VCO of the VCO quantizer, alternatively referred to herein as the identified phase location of the VCO (task 304). In an exemplary embodiment, the fold detection circuitry 206 identifies the phase of the VCO 212 by identifying adjacent locations within the VCO 212 having a common logic level at the time of the preceding sample, and then identifying the succeeding location of the adjacent locations as the identified phase location. For example, if s0 and s1 had a common logic level at the time of the preceding sample, then the fold detection circuitry 206 identifies adjacent locations within the VCO 212 having a common logic level at the time of the preceding sample when b0 (which corresponds to s0 at the time of the preceding sample) and b1 (which corresponds to s1 at the time of the preceding sample) are equal. If b0 and b1 have the same logic level, the fold detection circuitry 206 identifies the succeeding location in the direction of propagation of the oscillating signal within the VCO 212, that is, s1 as the identified phase location.

In an exemplary embodiment, the quantization process 300 continues by determining or otherwise identifying whether a fold condition occurred in the VCO quantizer (task 306). In this regard, the fold detection circuitry 206 identifies and/or detects a fold condition in the VCO quantizer 204 when the logic level at the identified phase location at the time of the current sample is equal to the logic level at the identified phase location at the time of the preceding sample. For example, if the identified phase location is s1, the fold detection circuitry 206 detects a fold condition in the VCO quantizer 204 when the logic level at the identified phase location for the current sample (i.e., a1) is equal to the logic level at the identified phase location for the preceding sample (i.e., b1).

In an exemplary embodiment, in response to detecting and/or identifying a fold condition in the VCO quantizer, the quantization process 300 continues by unfolding the digital code from the VCO quantizer (task 308). In this regard, the output generation circuitry 208 corrects the digital code in response to the fold condition by inverting the digital code to obtain the number of delay stages (or elements) of the n-element VCO greater than n that the oscillating signal has propagated through during the preceding sampling interval (i.e., k). The output generation circuitry 208 adds the number of delay stages of the n-element VCO to the inverted digital code (i.e., n) to the number of delay stages (or elements) of the n-element VCO greater than n that the oscillating signal has propagated through (i.e., k) to obtain the digital output value at the digital output interface 210 comprising a output thermometer code corresponding to n+k. In this regard, the digital output value is based on the digital code but has a code range greater than the code range of the thermometer code. In an exemplary embodiment, the code range of the digital output value corresponds to 0-(2n−1) or 2n quantization levels, while the code range of the digital code (or thermometer code) from the VCO quantizer has a code range corresponding to 0-n or n+1 quantization levels.

One advantage of the systems and/or methods described above is that n-element VCO (e.g., an n-level VCO quantizer) is utilized to achieve an output code range of 0-(2n−1), or in other words, the output code range of the quantization module is roughly twice the output code range of the VCO quantizer. In this regard, for an exemplary embodiment, the number of quantization levels achievable by the quantization module is equal to twice the number of delay stages (or CMOS inverters) within the VCO. Because a desired output code range can be achieved using a VCO quantizer with fewer CMOS inverters, the quantization module achieves a reduction in power and area consumption as compared to conventional VCO quantizers while achieving the same output code range.

Systems, devices, and methods configured in accordance with example embodiments of the invention relate to:

An apparatus is provided for a quantization circuit. The quantization circuit comprises an input node for an input signal, a voltage-controlled oscillator (VCO) quantizer coupled to the input node, and an output generation module coupled to the VCO quantizer. The VCO quantizer is configured to generate a digital code representative of the input signal, wherein the digital code has a first code range. The output generation module is configured to generate a digital output value having a second code range based on the digital code, wherein the second code range is greater than the first code range. In accordance with one embodiment, the VCO quantizer includes a VCO having a first number of delay stages, wherein the second code range corresponds to twice the first number. In another embodiment, the VCO quantizer includes an n-element VCO, n being an integer greater than one, wherein the second code range corresponds to 2n. In yet another embodiment, the VCO quantizer including a VCO having n delay stages, wherein the VCO quantizer is configured to generate the digital code by generating a first thermometer code having a code range corresponding to 0 through n and the output generation module generates the digital output value by generating an output thermometer code based on the first thermometer code. The output thermometer code has a code range corresponding to 0 through 2n−1. In accordance with another embodiment, the VCO quantizer includes a VCO having a first number of delay stages, wherein the output generation module comprises fold detection circuitry coupled to the VCO quantizer and output generation circuitry coupled to the VCO quantizer and the fold detection circuitry. The fold detection circuitry is configured to detect a fold condition in the VCO quantizer, the fold condition corresponding to a condition where the input signal causes an oscillating signal within the VCO to propagate through more than the first number of delay stages during a sampling interval. The output generation circuitry is configured to generate the digital output value by unfolding the digital code in response to detecting the fold condition. In a further embodiment, the fold detection circuitry comprises a phase detection arrangement configured to identify a location of a phase of the VCO, resulting in an identified phase location, and a fold detection arrangement coupled to the phase detection arrangement. The fold detection arrangement is configured to detect the fold condition when a logic level at the identified phase location for a current sample is equal to a logic level at the identified phase location for a preceding sample. In accordance with yet another embodiment, the output generation module is configured to toggle the digital output value.

In accordance with another embodiment, an apparatus is provided for an analog-to-digital converter. The analog-to-digital converter comprises an input node for receiving an input signal, a digital output interface, and a quantization module coupled between the input node and the digital output interface. The quantization module includes a voltage-controlled oscillator (VCO) quantizer configured for a first number of quantization levels. The quantization module is configured to generate a digital value at the digital output interface having a second number of quantization levels based at least in part on the input signal using the VCO quantizer, wherein the second number of quantization levels is greater than the first number of quantization levels. In accordance with one embodiment, the quantization module comprises fold detection circuitry coupled to the VCO quantizer, wherein the fold detection circuitry is configured to detect a fold condition in the VCO quantizer. In a further embodiment, the quantization module comprises output generation circuitry coupled to the VCO quantizer and the fold detection circuitry, wherein the VCO quantizer is configured to generate a first digital code based on the input signal and the first number of quantization levels and the output generation circuitry is configured to generate the digital value at the digital output interface by unfolding the first digital code in response to the fold detection circuitry detecting the fold condition. In another embodiment, the VCO quantizer includes a VCO comprising a third number of delay stages, wherein the second number is equal to twice the third number. In accordance with another embodiment, the analog-to-digital converter further comprises a forward signal arrangement coupled between the input node and the quantization module and a digital-to-analog conversion module coupled between the digital output interface and the forward signal arrangement. The digital-to-analog conversion module is configured to convert the digital value to an analog feedback signal, wherein the forward signal arrangement produces a first analog signal based on the input signal and the analog feedback signal and the quantization module generates the digital value based on the first analog signal. In a further embodiment, the quantization module is configured to toggle the digital value.

In accordance with another embodiment, a method for converting an analog input signal to a digital output value is provided. The method comprises generating a digital code using a voltage-controlled oscillator (VCO) quantizer, the digital code being representative of a voltage level of the analog input signal and having a first code range, and generating the digital output value based on the digital code, the digital output value being representative of the voltage level of the analog input signal and having a second code range, wherein the second code range is greater than the first code range. In accordance with one embodiment, the method further comprises detecting a fold condition in the VCO quantizer and correcting the digital code in response to the fold condition. In a further embodiment, the VCO quantizer includes a VCO, wherein detecting the fold condition comprises identifying a location of a phase of an oscillating signal in the VCO, resulting in an identified phase location, and detecting the fold condition when a logic level at the identified phase location for a current sample is equal to a logic level at the identified phase location for a preceding sample. In yet a further embodiment, identifying the location of the phase comprises identifying adjacent locations of the VCO having a common logic level for the preceding sample and identifying a succeeding location of the adjacent locations as the identified phase location. In accordance with another embodiment, correcting the digital code comprises inverting the digital code. In accordance with one embodiment, the VCO quantizer includes an n-element VCO, wherein generating the digital code comprises generating a first thermometer code having the first code range, the first code range corresponding to n+1, and generating the digital output value based on the digital code comprises generating an output thermometer code having the second code range based on the first thermometer code, the second code range corresponding to 2n. In accordance with another embodiment, the VCO quantizer includes a VCO having a first number of stages, wherein generating the digital code using the VCO quantizer comprises generating a first thermometer code having the first number of bits, wherein the first code range corresponds to zero through the first number, and generating the digital output value comprises generating an output thermometer code based on the first thermometer code having a second number of bits, the second number being equal to twice the first number, wherein the second code range corresponds to zero through the second number minus one.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A quantization circuit comprising:
   an input node for an input signal;
   a voltage-controlled oscillator (VCO) quantizer coupled to the input node, the VCO quantizer including a VCO having a first number of delay stages, the VCO quantizer being configured to generate a digital code representative of the input signal, the digital code having a first code range; and
   an output generation module coupled to the VCO quantizer, the output generation module being configured to generate a digital output value having a second code range based on the digital code, the second code range being greater than the first code range, wherein the second code range corresponds to twice the first number.

2. The quantization circuit of claim 1, the VCO quantizer including an n-element VCO, wherein the second code range corresponds to 2n, where n is an integer greater than one.

3. The quantization circuit of claim 1, the VCO having n delay stages, wherein:
   the VCO quantizer is configured to generate the digital code by generating a first thermometer code having a code range corresponding to 0 through n; and
   the output generation module generates the digital output value by generating an output thermometer code based on the first thermometer code, the output thermometer code having a code range corresponding to 0 through 2n−1.

4. The quantization circuit of claim 1, wherein the output generation module is configured to toggle the digital output value.

5. A quantization circuit comprising:
   an input node for an input signal;
   a voltage-controlled oscillator (VCO) quantizer coupled to the input node, the VCO quantizer including a VCO having a first number of delay stages, the VCO quantizer being configured to generate a digital code representative of the input signal, the digital code having a first code range; and
   an output generation module coupled to the VCO quantizer, the output generation module being configured to generate a digital output value having a second code range based on the digital code, the second code range being greater than the first code range, wherein the output generation module comprises:
      fold detection circuitry coupled to the VCO quantizer, the fold detection circuitry being configured to detect a fold condition in the VCO quantizer, the fold condition corresponding to a condition where the input signal causes an oscillating signal within the VCO to propagate through more than the first number of delay stages during a sampling interval; and
      output generation circuitry coupled to the VCO quantizer and the fold detection circuitry, the output generation circuitry being configured to generate the digital output value by unfolding the digital code in response to detecting the fold condition.

6. The quantization circuit of claim 5, wherein the fold detection circuitry comprises:
   a phase detection arrangement configured to identify a location of a phase of the VCO, resulting in an identified phase location; and
   a fold detection arrangement coupled to the phase detection arrangement, the fold detection arrangement being configured to detect the fold condition when a logic level at the identified phase location for a current sample is equal to a logic level at the identified phase location for a preceding sample.

7. An analog-to-digital converter comprising:
   an input node for receiving an input signal;
   a digital output interface; and
   a quantization module coupled between the input node and the digital output interface, the quantization module including a quantizer output coupled to the digital output interface and a voltage-controlled oscillator (VCO) quantizer configured for a first number of quantization levels, wherein the quantization module is configured to generate a digital value at the quantizer output having a second number of quantization levels based at least in part on the input signal using the VCO quantizer, the second number of quantization levels being greater than the first number of quantization levels, the VCO quantizer including a VCO comprising a third number of delay stages, wherein the second number is equal to twice the third number.

8. The analog-to-digital converter of claim 7, further comprising:
a forward signal arrangement coupled between the input node and the quantization module; and
a digital-to-analog conversion module coupled between the quantizer output and the forward signal arrangement, the digital-to-analog conversion module being configured to convert the digital value to an analog feedback signal, wherein:
the forward signal arrangement produces a first analog signal based on the input signal and the analog feedback signal; and
the quantization module generates the digital value based on the first analog signal.

9. The analog-to-digital converter of claim 8, wherein the quantization module is configured to toggle the digital value.

10. An analog-to-digital converter comprising:
an input node for receiving an input signal;
a digital output interface; and
a quantization module coupled between the input node and the digital output interface, the quantization module including a voltage-controlled oscillator (VCO) quantizer configured for a first number of quantization levels, wherein the quantization module is configured to generate a digital value at the digital output interface having a second number of quantization levels based at least in part on the input signal using the VCO quantizer, the second number of quantization levels being greater than the first number of quantization levels, wherein the quantization module comprises fold detection circuitry coupled to the VCO quantizer, the fold detection circuitry being configured to detect a fold condition in the VCO quantizer.

11. The analog-to-digital converter of claim 10, the quantization module further comprising output generation circuitry coupled to the VCO quantizer and the fold detection circuitry, wherein:
the VCO quantizer is configured to generate a first digital code based on the input signal and the first number of quantization levels; and
the output generation circuitry is configured to generate the digital value at the digital output interface by unfolding the first digital code in response to the fold detection circuitry detecting the fold condition.

12. An analog-to-digital converter comprising:
an input node for receiving an input signal;
a digital output interface; and
a quantization module coupled between the input node and the digital output interface, the quantization module including a voltage-controlled oscillator (VCO) quantizer configured for a first number of quantization levels, wherein the quantization module is configured to generate a digital value at the digital output interface having a second number of quantization levels based at least in part on the input signal using the VCO quantizer, the second number of quantization levels being greater than the first number of quantization levels, the VCO quantizer including a VCO comprising a third number of delay stages, wherein the second number is equal to twice the third number.

13. A method for converting an analog input signal to a digital output value, the method comprising:
generating a digital code using a voltage-controlled oscillator (VCO) quantizer, the digital code being representative of a voltage level of the analog input signal and having a first code range;
detecting a fold condition in the VCO quantizer;
correcting the digital code in response to the fold condition; and
generating the digital output value based on the digital code, the digital output value being representative of the voltage level of the analog input signal and having a second code range, wherein the second code range is greater than the first code range.

14. The method of claim 13, the VCO quantizer including a VCO, wherein detecting the fold condition comprises:
identifying a location of a phase of an oscillating signal in the VCO, resulting in an identified phase location; and
detecting the fold condition when a logic level at the identified phase location for a current sample is equal to a logic level at the identified phase location for a preceding sample.

15. The method of claim 14, wherein identifying the location of the phase comprises:
identifying adjacent locations of the VCO having a common logic level for the preceding sample; and
identifying a succeeding location of the adjacent locations as the identified phase location.

16. The method of claim 13, wherein correcting the digital code comprises inverting the digital code.

17. The method of claim 13, the VCO quantizer including an n-element VCO, wherein:
generating the digital code comprises generating a first thermometer code having the first code range, the first code range corresponding to n+1; and
generating the digital output value based on the digital code comprises generating an output thermometer code having the second code range based on the first thermometer code, the second code range corresponding to 2n.

18. The method of claim 13, the VCO quantizer including a VCO having a first number of stages, wherein:
generating the digital code using the VCO quantizer comprises generating a first thermometer code having the first number of bits, wherein the first code range corresponds to zero through the first number; and
generating the digital output value comprises generating an output thermometer code based on the first thermometer code having a second number of bits, the second number being equal to twice the first number, wherein the second code range corresponds to zero through the second number minus one.

* * * * *